(12) United States Patent
Hwang et al.

(10) Patent No.: US 7,504,148 B2
(45) Date of Patent: *Mar. 17, 2009

(54) PRINTED CIRCUIT BOARD STRUCTURE AND MANUFACTURING METHOD THEREOF

(75) Inventors: Ming-Hang Hwang, Taipei (TW); Yu-Chiang Cheng, Taipei (TW); Chao-Yi Chen, Taipei (TW); Hsin-Lung Kuo, Taipei (TW); Bin-Wei Lee, Taipei (TW); Wei-Chung Hsiao, Taipei (TW)

(73) Assignee: Mitac Technology Corp, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/307,854

(22) Filed: Feb. 24, 2006

(65) Prior Publication Data

US 2006/0257664 A1   Nov. 16, 2006

(30) Foreign Application Priority Data

Mar. 3, 2005   (TW) .............................. 94106499 A

(51) Int. Cl.
*B32B 3/00* (2006.01)
*H05K 1/09* (2006.01)

(52) U.S. Cl. ..................... 428/209; 428/210; 428/432; 428/539.5; 174/257; 174/258

(58) Field of Classification Search ................. 428/210, 428/615, 620, 209, 539.5, 432; 174/257, 174/258

See application file for complete search history.

(56) References Cited

U.S. PATENT DOCUMENTS

| | | | |
|---|---|---|---|
| 4,734,339 A | 3/1988 | Schachner | |
| 5,020,583 A * | 6/1991 | Aghajanian et al. ............ | 164/97 |
| 5,045,972 A | 9/1991 | Supan | |
| 5,070,936 A | 12/1991 | Carroll | |
| 5,347,426 A * | 9/1994 | Dermarkar et al. .......... | 361/708 |
| 5,366,688 A | 11/1994 | Terpstra et al. | |
| 5,389,400 A | 2/1995 | Ting et al. | |
| 5,552,635 A | 9/1996 | Kim et al. | |

(Continued)

FOREIGN PATENT DOCUMENTS

CN   1014805 B   1/1987

(Continued)

*Primary Examiner*—Cathy Lam
(74) *Attorney, Agent, or Firm*—Apex Juris, PLLC; Tracy M Heims

(57) ABSTRACT

This invention discloses a manufacturing method and a structure for printed circuit boards. The printed circuit boards are often used for supporting electronic components in circuit and conducting the heat from electronic components. The printed circuit board structure includes a laminated structure. The laminated structure comprises an electric conduction layer and an insulation layer. The electric conduction layer can be made of a special thermal conduction material, including a metal and a bracket structure of carbon element. The insulation layer can be made of thermal conduction material as well, combining a bracket structure of carbon element. The bracket structure of carbon element has high thermal conductivity so as to improve the heat conduction efficiency. The corresponding manufacturing method for this thermal conduction material can be made with chemical vapor deposition, physical vapor deposition, electroplating or the other materials preparation method. The bracket structure of carbon element can be coated on a surface of the metal and also can be mixed into the metal.

3 Claims, 6 Drawing Sheets

U.S. PATENT DOCUMENTS

| | | | |
|---|---|---|---|
| 5,591,034 A | 1/1997 | Ameen et al. | |
| 5,642,779 A | 7/1997 | Yamamoto et al. | |
| 5,660,917 A * | 8/1997 | Fujimori et al. | 428/195.1 |
| 5,738,936 A * | 4/1998 | Hanrahan | 428/313.5 |
| 5,925,413 A | 7/1999 | Holzer | |
| 5,944,097 A * | 8/1999 | Gungor et al. | 165/185 |
| 6,039,641 A * | 3/2000 | Sung | 451/540 |
| 6,055,154 A | 4/2000 | Azar | |
| 6,165,612 A * | 12/2000 | Misra | 428/344 |
| 6,171,691 B1 * | 1/2001 | Nishibayashi | 428/325 |
| 6,255,376 B1 | 7/2001 | Shikata | |
| 6,482,248 B1 * | 11/2002 | Holloway | 75/249 |
| 6,496,373 B1 | 12/2002 | Chung | |
| 6,844,054 B2 | 1/2005 | Whatley | |
| 6,884,522 B2 * | 4/2005 | Adams et al. | 428/614 |
| 6,987,318 B2 * | 1/2006 | Sung | 257/720 |
| 7,141,310 B2 * | 11/2006 | Adams et al. | 428/614 |
| 7,147,367 B2 | 12/2006 | Balian et al. | |
| 2002/0023733 A1 | 2/2002 | Hall et al. | |
| 2003/0152773 A1 | 8/2003 | Chrysler | |
| 2004/0105237 A1 | 6/2004 | Hoover | |
| 2004/0175875 A1 | 9/2004 | Sung | |
| 2004/0183172 A1 | 9/2004 | Saito | |

FOREIGN PATENT DOCUMENTS

| | | |
|---|---|---|
| CN | 85104959 | 1/1987 |
| CN | 1567131 | 1/2005 |
| EP | 1469513 | 10/2004 |
| JP | 62024647 A | 2/1987 |
| JP | 06330325 A | 11/1994 |
| JP | 2005005528 | 1/2005 |
| KR | 1020010064620 A | 7/2001 |
| TW | 552841 | 9/2003 |
| WO | WO 2004/080914 A1 | 9/2004 |

* cited by examiner

PRINTED CIRCUIT BOARD STRUCTURE AND MANUFACTURING METHOD THEREOF

FIELD OF THE INVENTION

The present invention relates to a printed circuit board structure and a manufacturing method and, more particularly, to a thermal conduction material which comprises a metal and a bracket structure of carbon element and another thermal conduction material which is combined the bracket structure of carbon element for manufacturing the printed circuit board structure.

BACKGROUND OF THE INVENTION

In recent years, the pace of high technology industry development is extremely fast, the development of electronic components is toward small volumes and high densities. Therefore, the performance of the electronic components is increased and the power consumption of the electronic components is also increased that generates much waste heat indirectly. Although these waste heat generated by the high temperature can be discharged by the heat dissipation devices, the material of insulation layers of printed circuit boards which are used for supporting the electronic components would be influenced by the high temperature that causes deterioration. The printed circuit boards would produce warp and damages. Accordingly, various thermal conduction materials are provided to improve the efficiency of heat dissipation.

The material which is applied for the printed circuit boards usually includes fiber glasses, linen, papers . . . etc. The material is combined with resins to form insulating plates for holding the electronic components. The surfaces of the insulating plates are electroplated or are stacked by copper foils to be the conducting material, so as to form copper-clad laminates. The copper-clad laminates are then formed to the printed circuit boards by using surface etching. To face the current environments and the high densities of the electronic components, the development of the printed circuit boards is that an insulating plate is plated by a single plate which is composed of a single copper foil in early stage. Afterward, multi-plates are then used that are composed of a plurality of insulating plates which combine a plurality of copper foils. Firstly, the manufacturing for conventional printed circuit boards is briefly described as follows.

Referring to FIG. 1, a flowchart illustrates a manufacturing for making a conventional printed circuit board. Step S11: A conventional substrate can be fiber glasses, linen, ceramic material, etc. Step S12: The aforesaid substrate is mixed with resins to form a semi-finished good for an insulating plate. The resins can be thermosetting resins which include epoxy resins, phenolics, etc. Step S13: The semi-finished good is cut to compose various specifications. Step S14: The cut semi-finished goods are then sent to an oven for baking, so as to form an insulating plate with half-baked. The oven can be a horizontal oven or a vertical oven. Step S15: The insulating plate is stacked by copper foils to form an electric conduction layer. Step S16: The insulating plate is then baked again to form a copper-clad laminate. Step S17: The copper-clad laminate is etched by the surface etching to shape lines to provide circuit connections. Lastly, the printed circuit board can be made by way of these steps S11~S17. In regard with the structure of the printed circuit board and its heat conduction referring to FIG. 2, a structural drawing illustrates the conventional printed circuit board. The printed circuit board comprises a copper-film 21 which is formed an electric conduction layer, an insulating plate 22 which is formed an insulation layer, a plurality of holes 23, a heat sink fin 24 and a plurality of electronic components 25. The copper-film 21 is isolated from copper sulphate. The plurality of electronic components is set on an upper surface 211 of the copper-film 21. A lower surface of 212 of the copper-film 21 is combined with the insulation layer which is composed of the insulating plate 22. The insulating plate is made as described as in FIG. 1 that the substrate which can be fiber glasses, linen or ceramic material is mixed with resins as step S12. A surface 221 of the insulating plate 22 can connect with the heat sink fin 24. The heat sink fin 24 can be aluminum and the plurality of holes 23 is made by PCB drilling machines to penetrate the copper-film 21 and the insulating plate 22 to form verticality. The plurality of holes 23 is a column shape with hollow. Screws can be assembled into the plurality of holes 23 to connect a base for stabilizing. The screws can support heat dissipation as well. The heat conduction procedure is: Some waste heat can be discharged by heat dissipation devices which are set on the plurality of electronic components 25 when the plurality of electronic components 25 is operating to raise temperature to generate waste heat. Remaining waste heat is conducted to the insulating plate 22 through the copper-film 21 and is then conducted to the heat sink fin 24 which is pasted to the insulating plate 22 and the screws which are assembled into the plurality of holes 23 for dissipating.

Although a heat sink fin of the printed circuit board as shown in FIG. 2 is used to support the heat conduction, the space is insufficient when the electronic components are toward miniaturization. The heat conduction may rely on the body of the printed circuit board without setting heat dissipation devices. Therefore, a thermal conduction material is provided to apply for the printed circuit board.

Besides, diamonds are well known and have characteristics with the highest hardness, the fastest heat conduction, and the widest refraction range. Diamonds, therefore, are always one of more important materials in engineering due to the excellent characteristics. The thermal conductivity of diamonds at the normal atmospheric temperature is five times more than copper. Moreover, the thermal expansion factor of diamonds at high temperature is very small that shows the excellent efficiency of heat dissipation. The feature may help people to differentiate the adulteration of diamonds. In the prior art, many technologies and manufacture methods have been developed to make diamonds. The direct decomposition for hydrocarbons is the most familiar method like Microwave Plasma Enhance Chemical Vapor Deposition (MPCVD) and Hot Filament CVD (HFCVD). By the aforesaid methods, polycrystalline diamond films can be deposited. The characteristic of the polycrystalline diamond films is same as the single crystal diamonds. Moreover, the diamonds can be used to different industries.

SUMMARY OF THE INVENTION

Accordingly, to efficiently eliminate the waste heat generated by electronic components and to face the development tendency of electronic components with small volumes and high densities, the object of the present invention is to provide a thermal conduction material which is applied for a printed circuit board structure and its manufacturing method. The waste heat caused by the high temperature, which is generated from the operation of electronic components can be reduced and the efficiency of heat resistant for the printed circuit board structure can be improved. Therefore, there is no need to set various heat dissipation devices or heat dissipation media on a surface of the printed circuit board to waste limited spaces after the volumes of electronic apparatus are shrunk. Furthermore, the material deterioration for an insulation layer of the printed circuit board structure caused by the high temperature can be eliminated without decreasing the ability for holding electronic components. In addition, the thermal conduction material provided by the present invention is not only restricted in the printed circuit board, but is also applied to other thermal conduction apparatuses.

Other features and advantages of the present invention and variations thereof will become apparent from the following description, drawings, and claims.

DETAILED DESCRIPTION OF THE PREFERRED EMBODIMENTS

Figure 1:
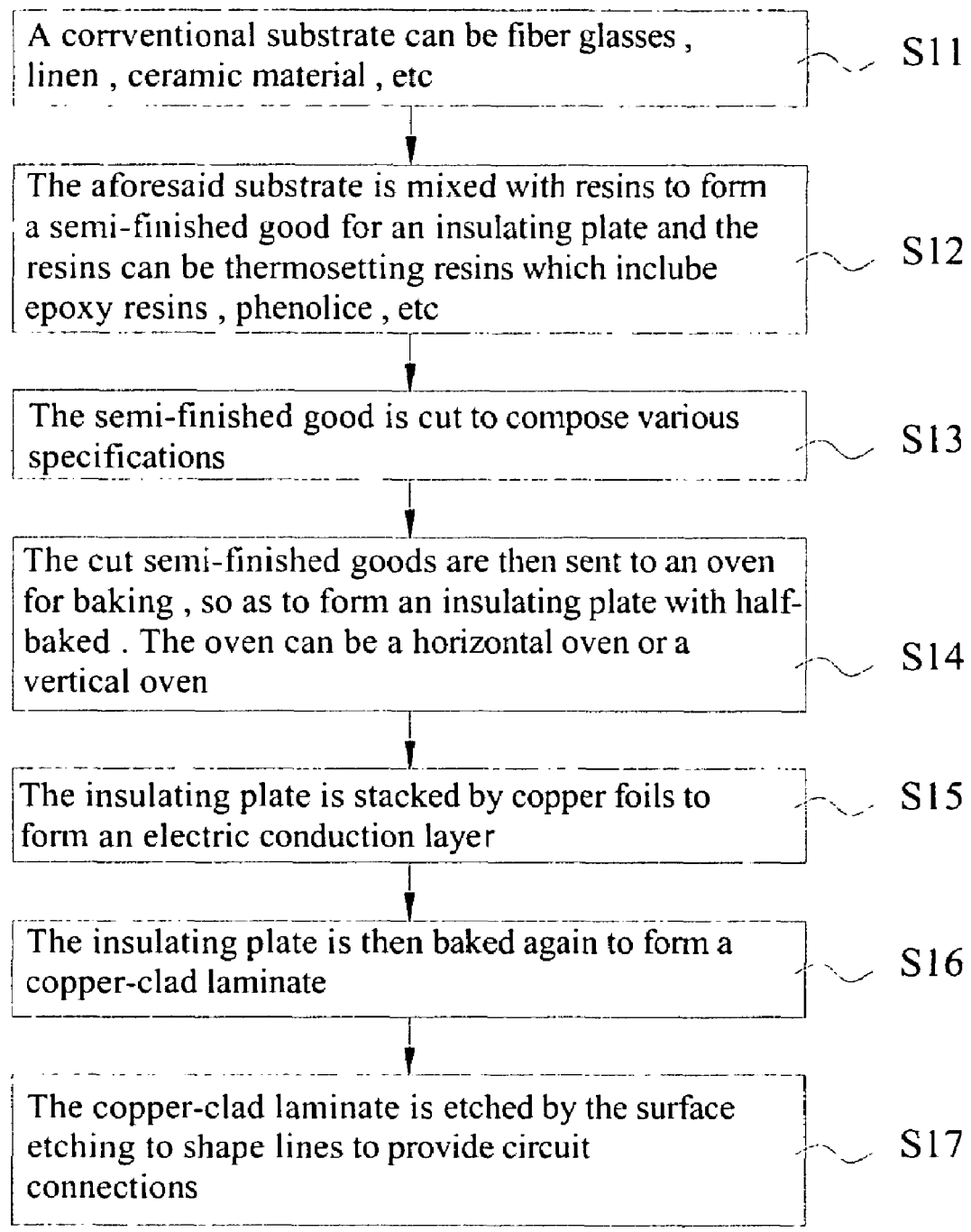
FIG. 1 is a flowchart illustrating a manufacturing for making a conventional printed circuit board.
Figure 2:
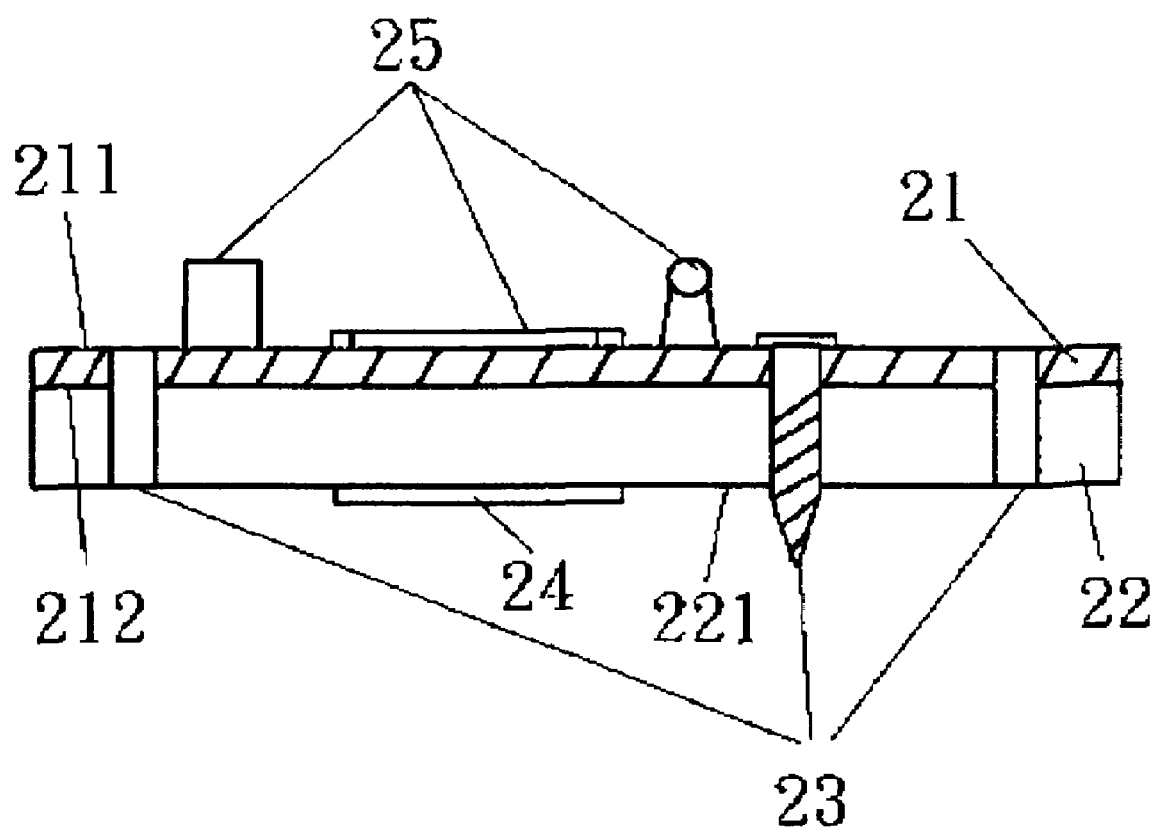
FIG. 2 is a structural drawing illustrating the conventional printed circuit board.
Figure 3:
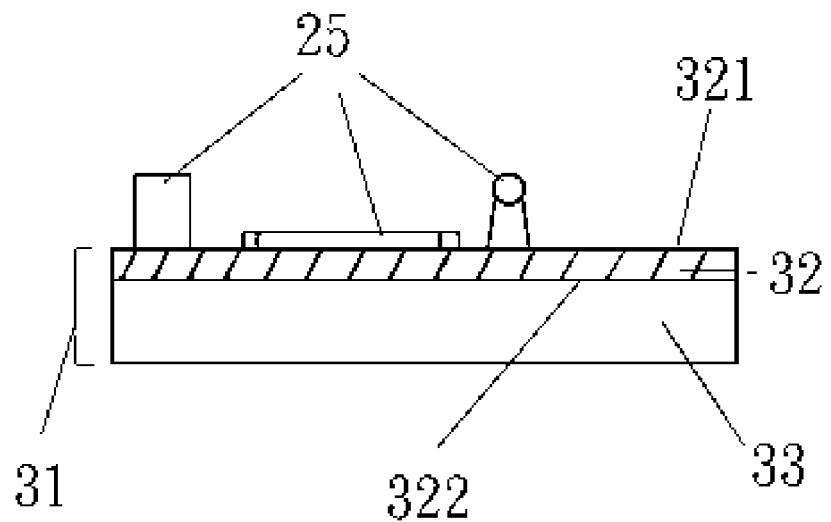
FIG. 3 is a schematic diagram illustrating a printed circuit board according to an embodiment of the present invention.

Referring to FIG. 3, a schematic diagram illustrates a printed circuit board according to an embodiment of the present invention. The printed circuit board comprises a laminated structure 31 which includes at least an electric conduction layer 32 and an insulation layer 33. The electric conduction layer 32 has an upper surface 321 for carrying the plurality of electronic components 25 as shown in FIG. 2. A lower surface 322 which is corresponded to the upper surface 321 of the electric conduction layer 22 is pasted to the insulation layer 33. A thermal conduction material which is used for the electric conduction layer 32 is composed of combining a metal with a bracket structure of carbon element. Another thermal conduction material which is used for the insulation layer 33 is composed of combining the bracket structure of carbon element. The printed circuit board can be formed by above thermal conduction materials.

Figure 4:
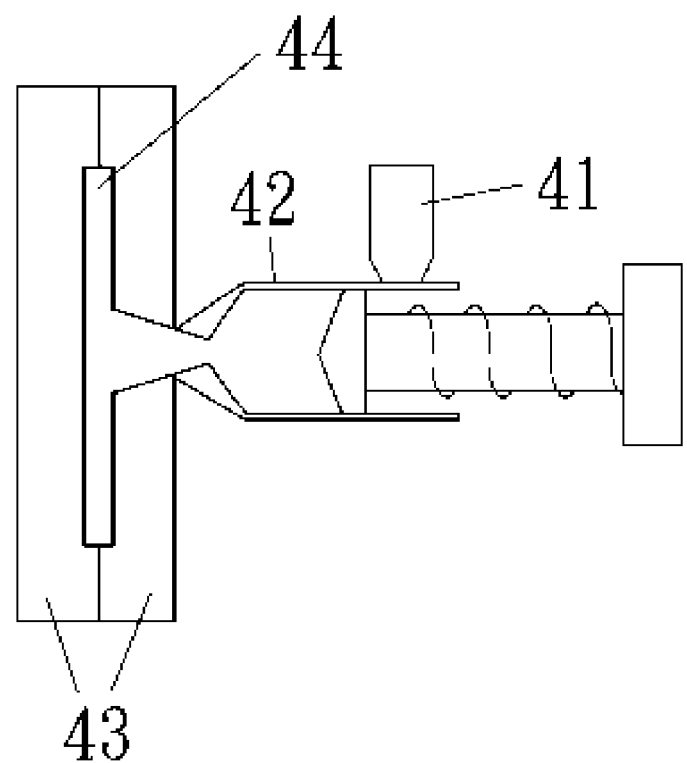
FIG. 4 is a schematic diagram illustrating an insulation layer of the printed circuit board structure by using a die to form a first manufacturing according to FIG. 3.

Referring to FIG. 4, a schematic diagram illustrates an electric conduction layer 32 of the printed circuit board structure by using a die to form a first manufacturing according to FIG. 3. The die comprises a mold material supplier 41, a mold material injector 42 and molds 43. A mold material is injected by the mold material injector 42 to a cavity 44 of the molds 43 which is formed a shape of the electric conduction layer 32 for molding. The mold material is then formed the electric conduction layer 32 as shown in FIG. 3. The electric conduction layer 32 includes the upper surface 321 and the lower surface 322. The mold material comprises a melt material which combines a metal with a bracket structure of carbon element. The metal is copper, aluminum or other metals with high thermal conductivity or material combinations. The melting point of the bracket structure of carbon element is higher than any metal of the mentioned above. Therefore, the bracket structure of carbon element can be mixed with those metals to form a mold material.

Figure 5:
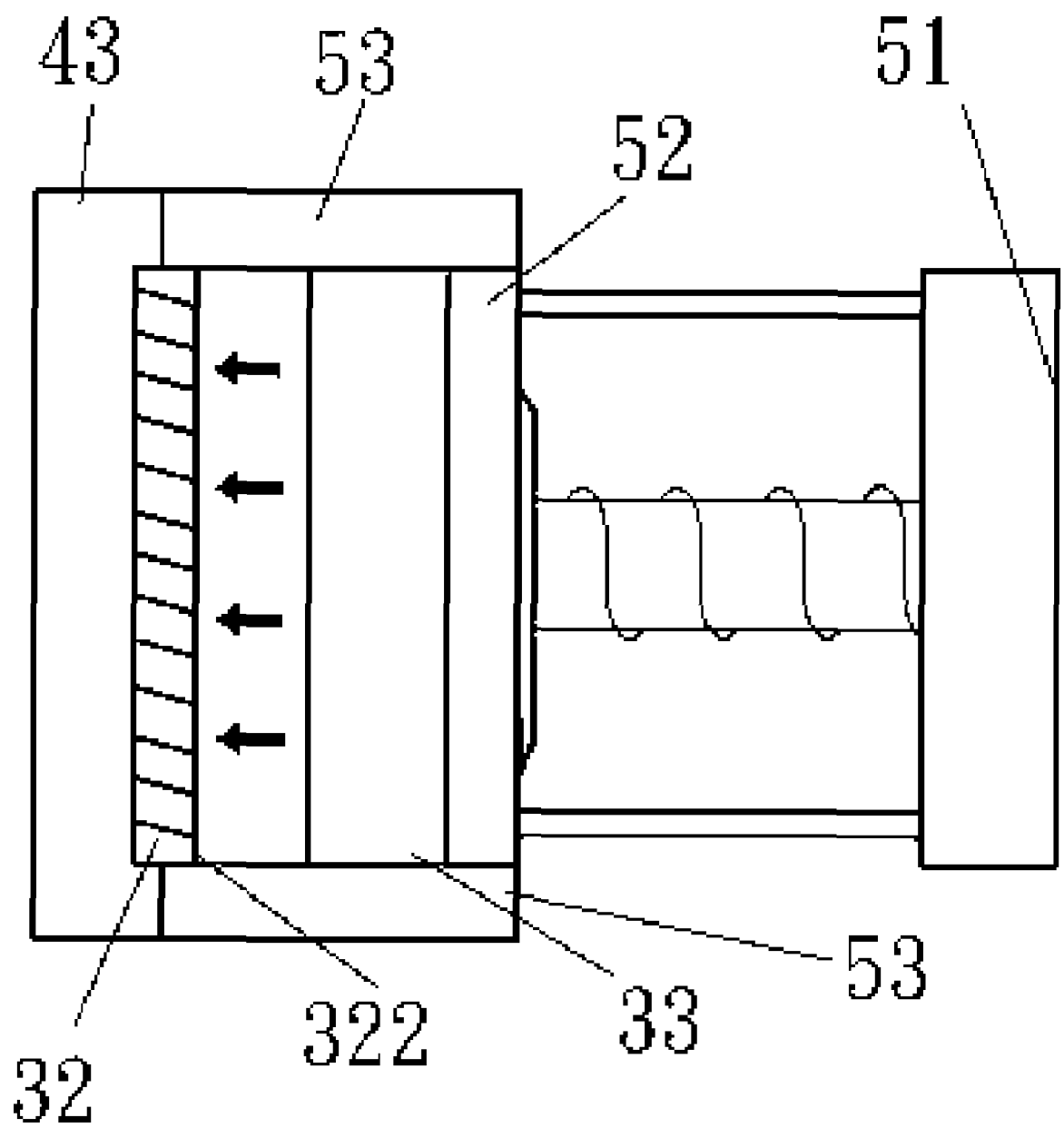
FIG. 5 is a schematic diagram illustrating a combination for manufacturing a laminated structure according to an embodiment of the present invention.

Referring to FIG. 5, a schematic diagram illustrates a combination for manufacturing a laminated structure 31 according to an embodiment of the present invention. The combination comprises a press machine tool 51 for pressing, a flexible mold bottom 52 for manufacturing the insulation layer 33 as shown in FIG. 3, a frame mold 53. The mold 43 as shown in FIG. 4 is removed a side to appear the lower surface 322 of the electric conduction layer 32 which is formed by the cavity 44 as shown in FIG. 3. The frame mold 53 is adhered to the mold 43 as shown in FIG. 4. The insulation layer 33 on the flexible mold bottom 52 is pressurized by the press machine tool 51 to stack the electric conduction layer 32 like the direction indicated by arrows in order to form the laminated structure 31 as shown in FIG. 3.

Figure 6:
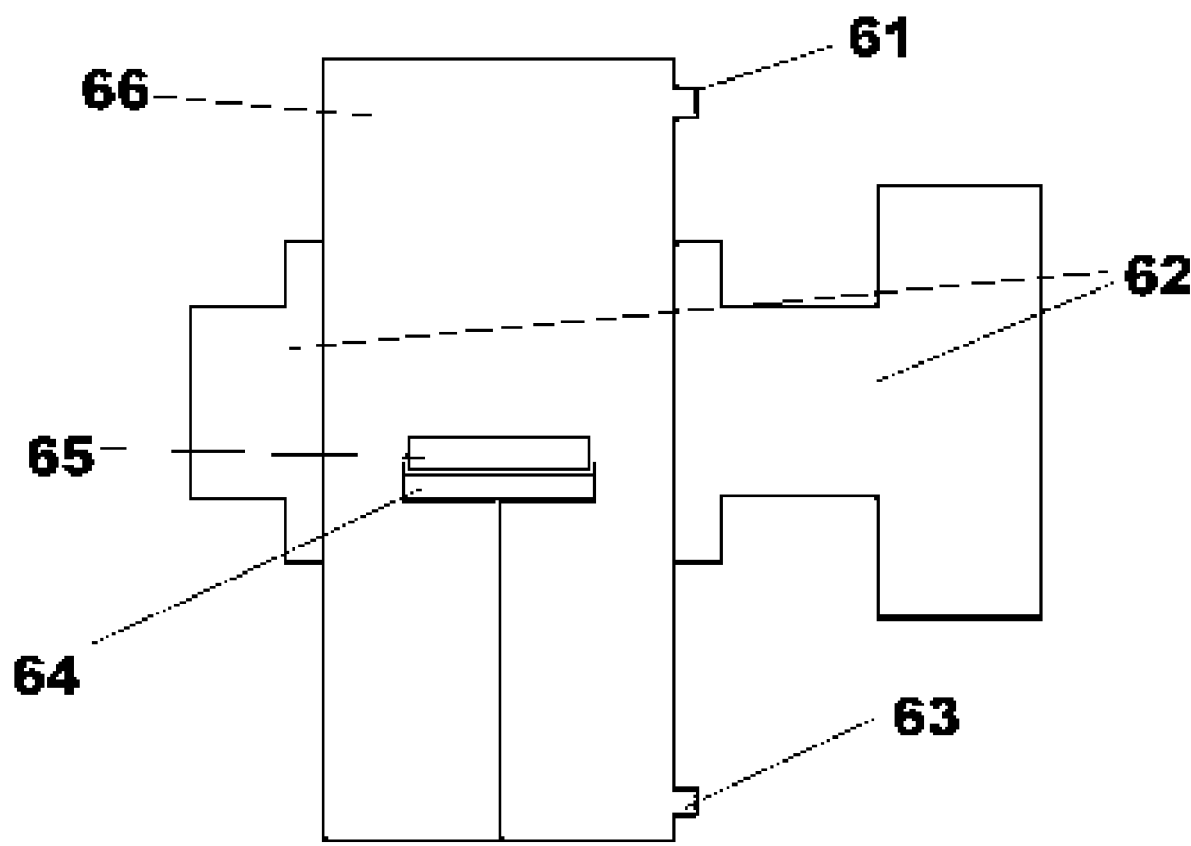
FIG. 6 is a schematic diagram illustrating a manufacturing for making a heat dissipation structure according to an embodiment of the present invention.

A thermal conduction material which is applied for the electric conduction layer 32 of the printed circuit board structure as shown in FIG. 3 can be made by chemical vapor deposition (CVD) or physical vapor deposition (PVD) to coat the bracket structure of carbon element on a surface of the metal to be the first manufacturing. Referring to FIG. 6, a schematic diagram illustrates a manufacturing for making a heat dissipation structure according to an embodiment of the present invention. In the embodiment, the reaction procedure is that a mixed gas for desired reaction is delivered to a gas reaction room 66 from a gas entrance 61. At the same time, a microwave is generated by a microwave generation system 62 to activate the mixed gas in order to provide reactive ions for reacting. A surface of a metal material 65 on a carrier 64 is absorbed to form a bracket structure of carbon element film (diamond films). The metal material 65 is the electric conduction layer 32 formed by the manufacturing as shown in FIG. 4. The electric conduction layer 32 can be copper, aluminum or other metal materials with high thermal conductivity or material combinations. Remaining gas is discharged via a waste gas exit 63. By the way mentioned above, a thermal conduction material coating diamond particles can be acquired.

In addition, another thermal conduction material which is applied for the insulation layer 33 of the printed circuit board is combined with the bracket structure of carbon element. Therefore, referring to FIG. 7, a flowchart illustrates a second manufacturing for making the insulation layer according to an embodiment of the present invention. Step S71: Raw materials which are used to form the insulation layer 33 are mixed. The raw materials comprise silica sand, limestone and boric acid to make glass substrates or comprise clay, flints, feldspar to make ceramic substrates or comprise other raw materials to make the substrate of the insulation layer 33 as shown in FIG. 3. Step S72: The mixed raw materials are then sent into a high temperature furnace for melting. Meanwhile, a diamond which is the bracket structure of carbon element is also sent into the high temperature furnace to mix with the mixed raw materials which have been melted. Step S73: The melt is infused into a space for forming and depositing. The space is composed of the flexible mold bottom 52 made by a specific alloy and the frame mold 53 also made by a specific alloy. The frame mold 53 is set on the sides of the flexible mold bottom 52. The insulation layer 33 coating another thermal conduction material which is the bracket structure of carbon element as shown in FIG. 3 can be obtained through these steps S71~S73.

Figure 7:
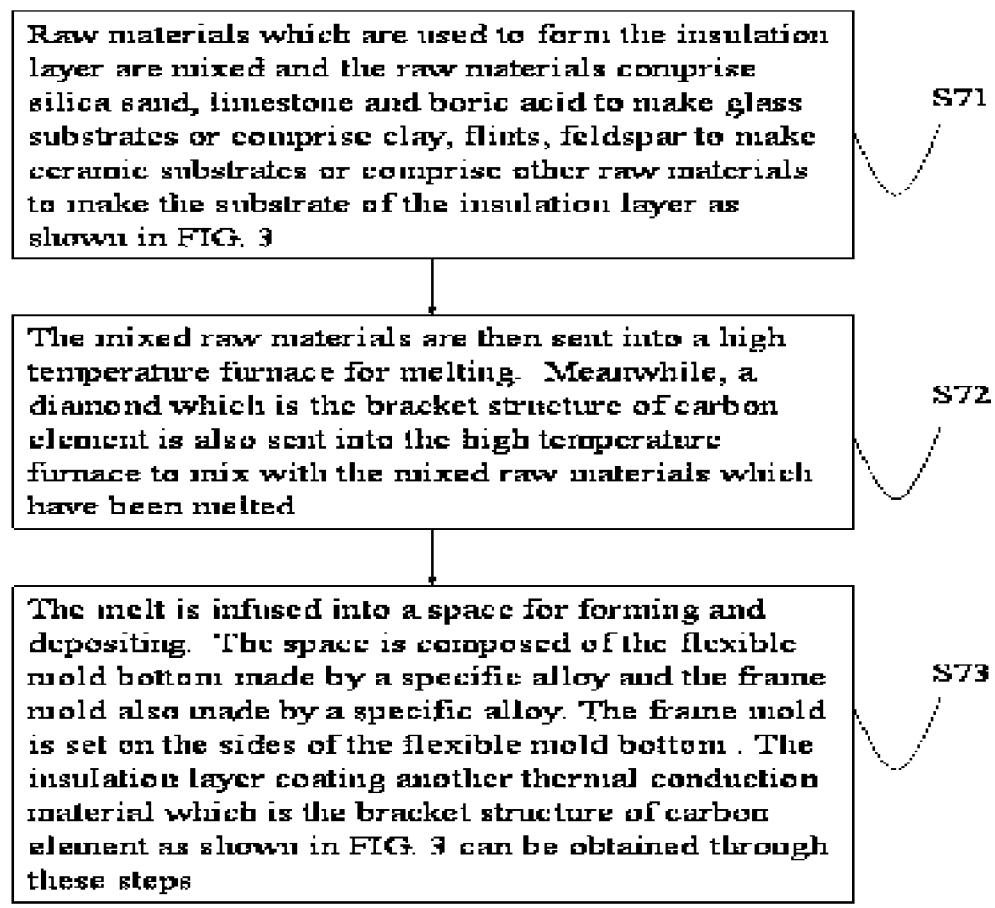
FIG. 7 is a flowchart illustrating flowchart illustrates a second manufacturing for making the insulation layer according to an embodiment of the present invention

Lastly, the electric conduction layer 32 formed by a thermal conduction material, which is made by a first manufacturing as shown in FIG. 4 is combined with the insulation layer 33 formed by another thermal conduction material, which is made by a second manufacturing as shown in FIG. 7 to obtain the laminated structure 31 as shown in FIG. 3 in order to form the printed circuit board structure.

Although the features and advantages of the embodiments according to the preferred invention are disclosed, it is not limited to the embodiments described above, but encompasses any and all modifications and changes within the spirit and scope of the following claims.

What is claimed is:

1. A printed circuit board structure, comprising:

an insulation layer; and at least one electric conduction layer has an upper surface and a lower surface, said electric conduction layer carrying a plurality of electronic components on the upper surface and the lower surface of said electric conduction layer being coupled onto said insulation layer; and wherein said electric conduction layer is made of a melted metal mixed with diamond and said insulation layer is made of a plurality of raw materials and diamond.

2. The printed circuit board structure of claim 1, wherein said metal is copper.

3. The printed circuit board structure of claim 1, wherein said metal is aluminum.

* * * * *